(12) United States Patent
Peirce

(10) Patent No.: US 7,915,897 B2
(45) Date of Patent: Mar. 29, 2011

(54) FOIL-LEAF ELECTROMETER FOR STATIC FIELD DETECTION WITH PERMANENTLY SEPARATING LEAVES

(75) Inventor: Roger J. Peirce, Bensalem, PA (US)

(73) Assignee: Illinois Tool Works Inc., Glenview, IL (US)

( * ) Notice: Subject to any disclaimer, the term of this patent is extended or adjusted under 35 U.S.C. 154(b) by 275 days.

(21) Appl. No.: 12/340,073

(22) Filed: Dec. 19, 2008

(65) Prior Publication Data

US 2010/0156428 A1   Jun. 24, 2010

(51) Int. Cl.
*G01R 29/12* (2006.01)
(52) U.S. Cl. .......................................... 324/457
(58) Field of Classification Search .................. None
See application file for complete search history.

(56) References Cited

U.S. PATENT DOCUMENTS

| | | | |
|---|---|---|---|
| 2,952,835 A | 9/1960 | Aiken | |
| 3,774,110 A * | 11/1973 | Roveti | 324/133 |
| 3,852,667 A | 12/1974 | Williams et al. | |
| 4,786,858 A | 11/1988 | Haas et al. | |
| 4,825,152 A | 4/1989 | Bossard | |
| 5,463,379 A | 10/1995 | Campbell et al. | |
| 5,517,123 A | 5/1996 | Zhao et al. | |
| 5,539,319 A | 7/1996 | Yamada et al. | |
| 5,673,028 A | 9/1997 | Levy | |
| 6,172,496 B1 | 1/2001 | Karins et al. | |
| 6,300,756 B2 | 10/2001 | Sturm et al. | |
| 6,737,871 B1 | 5/2004 | Schneider et al. | |
| 6,960,816 B2 * | 11/2005 | Boor | 257/423 |
| 7,098,644 B1 | 8/2006 | Denison | |
| 7,256,063 B2 | 8/2007 | Pinkerton et al. | |
| 7,357,017 B2 | 4/2008 | Felton et al. | |
| 7,548,066 B2 | 6/2009 | Ichimura et al. | |
| 2003/0006777 A1 | 1/2003 | Murphy | |
| 2005/0276726 A1 * | 12/2005 | McGill et al. | 422/96 |
| 2007/0182419 A1 | 8/2007 | Ushijima et al. | |
| 2008/0083286 A1 | 4/2008 | Danowski et al. | |
| 2010/0176808 A1 * | 7/2010 | Legay | 324/260 |

FOREIGN PATENT DOCUMENTS

| | | |
|---|---|---|
| JP | 11352170 | 12/1999 |
| JP | 200390853 | 3/2003 |
| JP | 2004045049 | 2/2004 |

OTHER PUBLICATIONS

Acceleration sensor for Wii, http://cache.kotaku.com/assets/resources/2006/12/nytwii.jpg. dated Dec. 2006, 1 page.
Beaty, William J., Ridiculously Sensitive Charge Detector, (C) 1987, 8 pages.
"Cantilever," Wikepedia, modified Oct. 1, 2008, accessed Nov. 17, 2008, 5 pages.
Electrometer, Wikipedia, modified May 7, 2008, 5 pages.
Electroscope, Wikipedia, modified Jun. 8, 2008, 3 pages.

* cited by examiner

*Primary Examiner* — Jermele M Hollington
(74) *Attorney, Agent, or Firm* — Panitch Schwarze Belisario & Nadel LLP

(57) ABSTRACT

An apparatus for detecting a static field includes two surfaces of conductive material that are (i) electrically coupled to each other, and adjacent to each other. The two surfaces repel each other in the presence of a static field. The conductive material has a deformation property such that stress caused by repulsion of the two surfaces from each other by at least a predetermined distance causes at least one of the surfaces to permanently deform.

13 Claims, 23 Drawing Sheets

FOIL-LEAF ELECTROMETER FOR STATIC FIELD DETECTION WITH PERMANENTLY SEPARATING LEAVES

CROSS-REFERENCE TO RELATED APPLICATIONS

This application is related to the following copending U.S. applications:

1. U.S. application Ser. No. 12/340,028 filed Dec. 19, 2008 entitled "Foil Leaf Electrometer for Static Field Detection with Triggered Indicator."

2. U.S. application Ser. No. 12/340,055 filed Dec. 19, 2008 entitled "MEMS Electrometer that Measures Amount of Repulsion of Adjacent Beams from Each Other for Static Field Detection."

BACKGROUND OF THE INVENTION

Electronics, such as those found on printed circuit boards (PCBs), can be very sensitive, and are likely to be damaged in the presence of a electrostatic (static) field. Such fields can be encountered during manufacturing, handling, shipping, and use of PCBs. Even the failure of a component as simple as a transistor on a PCB can be enough to ruin a larger device, such as a computer. The Electrostatic Discharge (ESD) Association has even proliferated Specification S20.20, which requires that all charge-generating materials that have electrostatic fields that exceed 2,000 volts (V) should be kept at least twelve inches away from ESD sensitive products at all times. Industrial sheet plastic web packaging and fluid cleaning processes are just a few of the many other applications that are also capable of generating damaging electrostatic fields.

A simple method of detecting the presence of an electric field was developed in the late 1700's. Two thin gold leaves are suspended from a conductive rod, forming a "gold-leaf electrometer." By contacting the conductive rod with an electrified piece of material, the gold leaves become identically charged through induction and repulse one another. This device is regarded as inaccurate and unstable.

Modern electrometers employ more sophisticated and accurate techniques of detecting and measuring the presence of charge. However, these devices can be expensive and are impractical for detecting fields under certain circumstances, such as within small equipment or fluids.

BRIEF SUMMARY OF THE INVENTION

An apparatus is provided for detecting a static field includes two surfaces of conductive material that are (i) electrically coupled to each other, and adjacent to each other. The two surfaces repel each other in the presence of a static field. The conductive material has a deformation property such that stress caused by repulsion of the two surfaces from each other by at least a predetermined distance causes at least one of the surfaces to permanently deform.

An apparatus is also provided for detecting a static field includes two surfaces of conductive material that are (i) electrically coupled to each other, and (ii) adjacent to each other in a rest position. The two surfaces repel each other in the presence of a static field. At least one of the surfaces has a movement path resulting from the repulsion of the two surfaces. At least one stopper is located in the movement path of at least one of the surfaces. The stopper prevents the at least one surface from returning to the rest position after the two surfaces are repulsed from one another by at least a predetermined distance.

BRIEF DESCRIPTION OF THE DRAWINGS

The foregoing summary, as well as the following detailed description of preferred embodiments of the invention, will be better understood when read in conjunction with the appended drawings. For the purpose of illustration, there is shown in the drawings an embodiment which is presently preferred. It should be understood, however, that the invention is not limited to the precise arrangements and instrumentalities shown.

DETAILED DESCRIPTION OF THE INVENTION

Figure 1:
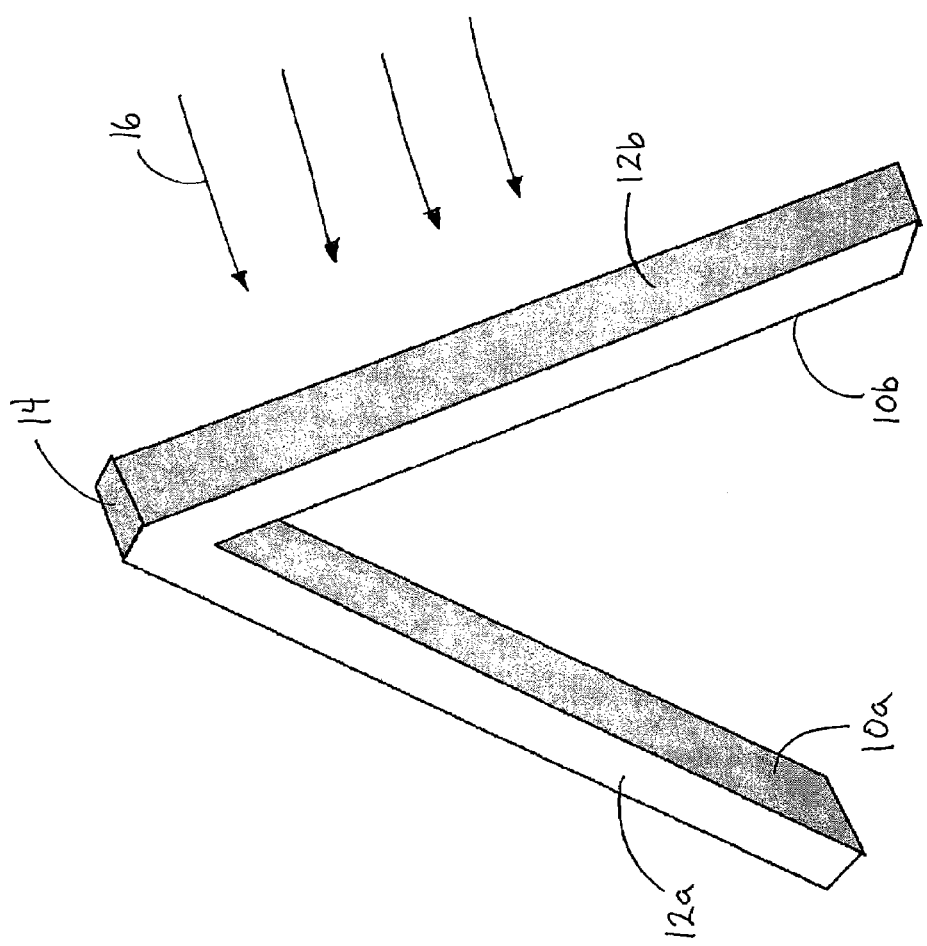
FIG. 1 is an enlarged perspective view of two surfaces for detecting the presence of a static field that may be used in preferred embodiments of the present invention as shown in FIGS. 4-15.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the apparatus and designated parts thereof. The terminology includes the above-listed words, derivatives thereof, and words of similar import. Additionally, the words "a" and "an", as used in the claims and in the corresponding portions of the specification, mean "at least one." In the drawings, the same reference numerals indicate like elements throughout.

FIG. 1 shows two surfaces 10a, 10b of a conductive material for use in preferred embodiments of the present invention. The conductive material may be copper, silver, aluminum, tin, gold, or another conductive metal, conductive plastic, a doped semiconductive material (e.g., silicon), or combinations thereof. The surfaces 10a, 10b may be respective surfaces of two beams 12a, 12b, but may also be fastened to, adhered to, or coated onto the beams 12a, 12b. The beams 12a, 12b may be constructed of a conductive material (either similar to or different from the material of the surfaces 10a, 10b), an insulative material, or a semiconductive material. The beams 12a, 12b and the surfaces 10a, 10b are preferably fastened at a common end 14.

Figure 2:
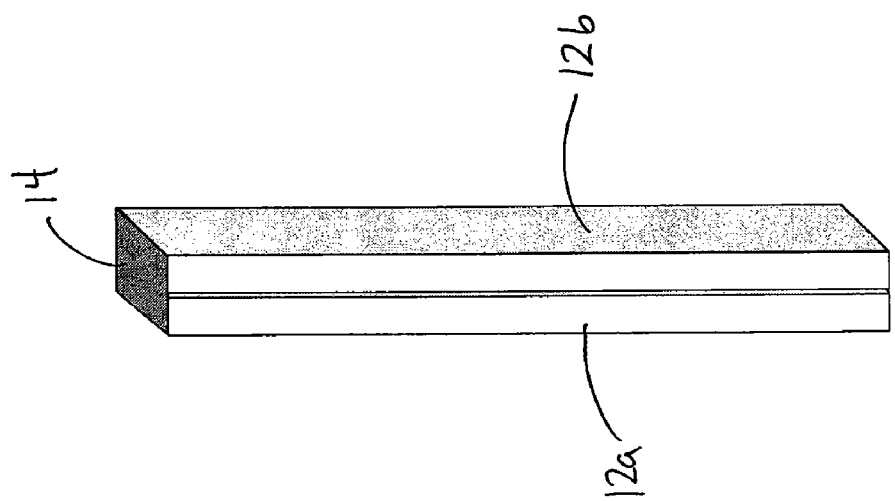
FIG. 2 is an enlarged perspective view of two surfaces adjacent to each other in a rest position that may be used in preferred embodiments of the present invention as shown in FIGS. 4-15.
Figure 3:
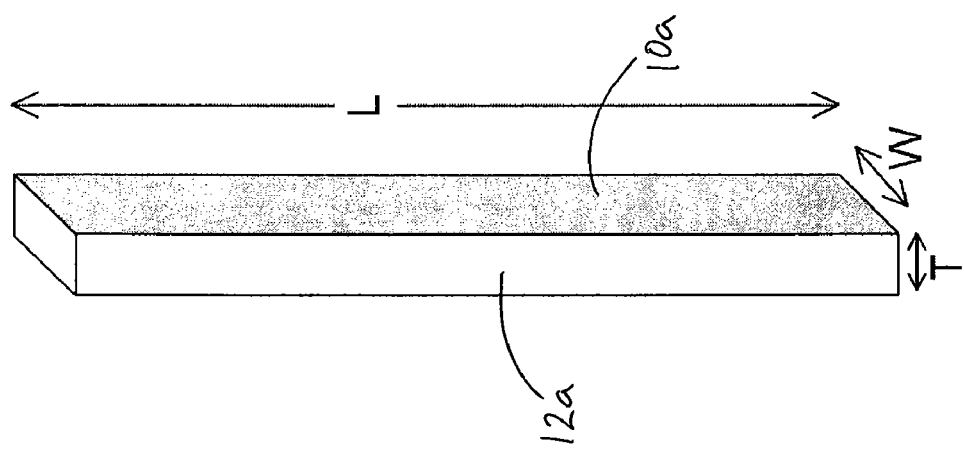
FIG. 3 is an enlarged perspective view of one of the surfaces of FIG. 1 or 2.

The beams 12a, 12b and/or the surfaces 10a, 10b may be formed by a single folded piece of conductive material, but may also be separate and distinct bodies that are fastened together or in close proximity to one another at the common end 14 (see FIG. 2). In preferred embodiments, the surfaces 10a, 10b face each other. As shown in FIG. 3, the surface 10a has a length dimension L and a width dimension W. The surface 10a also has a thickness dimension T, which is illustrated in FIG. 3 as being the thickness T of the entire beam 12a for instances when the surface 10a is a surface of the beam 12a of the same conductive material. When the surface 10a is fastened or adhered to the beam 12a, the thickness T includes only a thickness of the surface 10a. Surface 10b preferably is identically sized with respect to surface 10a. In preferred embodiments, the ratio of length L to width W to thickness T is 1 unit by 0.25 units by 0.001 units. For example, surfaces 10a, 10b of tin with dimensions of 1 inch by 0.25 inches by 0.001 inches exhibits a 2 inch separation in a 20 kilo-Volt (kV) static field, illustrated by field lines 16 in FIG. 1.

The surfaces 10a, 10b are preferably electrically coupled to each other, which is achieved in FIG. 1 by direct contact of the two surfaces 10a, 10b near the common end 14, although other techniques for electrical coupling may be utilized, such as by connecting the two surfaces 10a, 10b via a conductive material at the common end 14. As a result, the two surfaces 10a, 10b will be charged by field induction in the presence of a static field 16. Prior to being subjected to a static field 16, the two surfaces 10a, 10b are preferably adjacent to each other (see, e.g., FIG. 2), and may be substantially parallel to each other.

Figure 4:
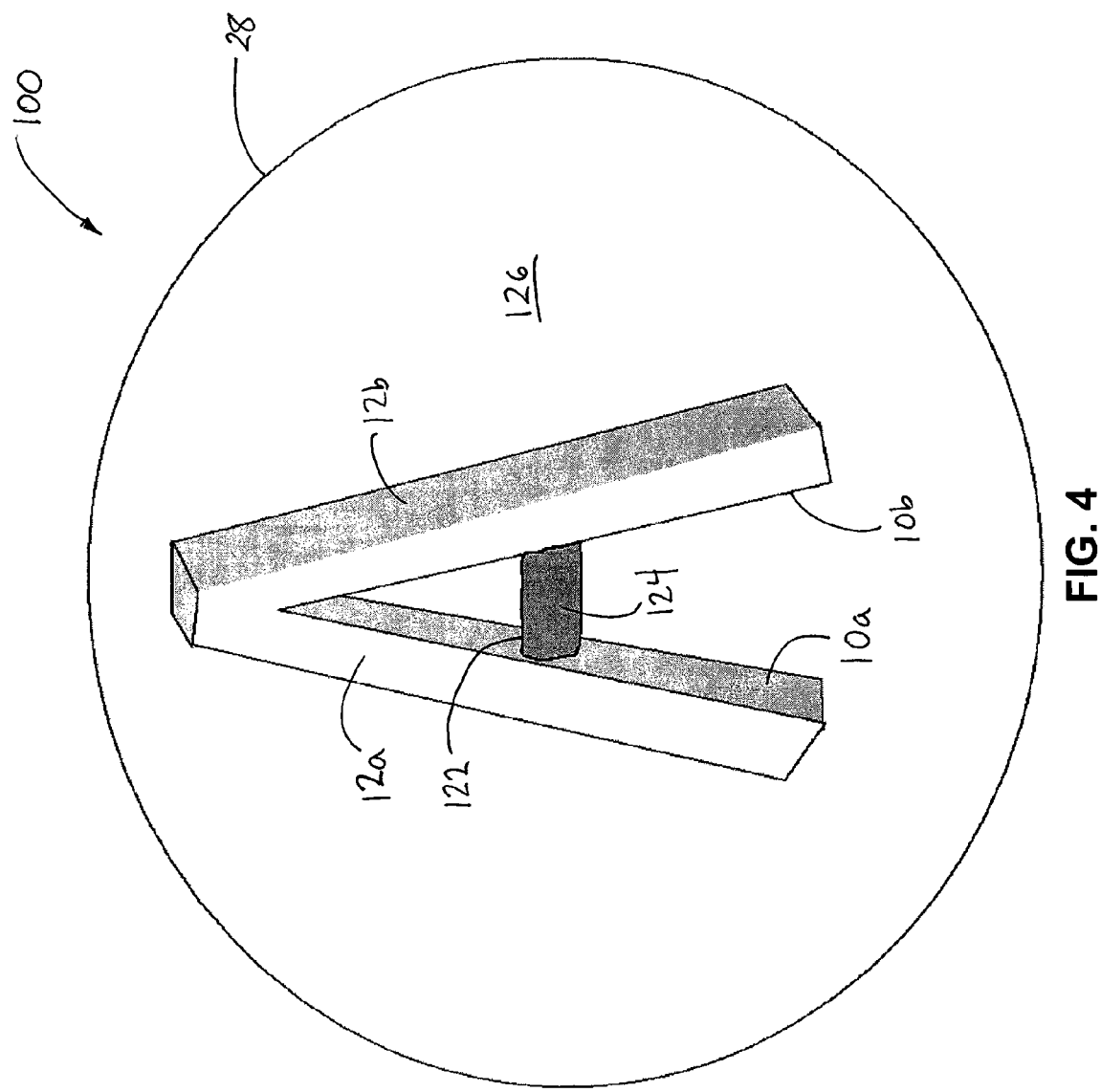
FIG. 4 is an enlarged perspective view of a static detecting apparatus having a rupturable indicator filled with encapsulated material in accordance with a preferred embodiment of the present invention.

FIG. 4 illustrates an apparatus 100 for detecting a static field 16 in accordance with certain preferred embodiments of the present invention. The apparatus 100 contains the two surfaces 10a, 10b and a rupturable indicator 122 that bridges and couples the surfaces 10a, 10b. The indicator 122 ruptures (e.g., FIG. 5) upon repulsion of the two surfaces 10a, 10b by at least a predetermined distance. The predetermined distance may, for example, be calculated to correspond to a threshold static field 16 strength that is undesirable for the particular application. The two surfaces 10a, 10b and the indicator 122 are preferably surrounded by a clear insulative cover 28, which may be formed from glass, plastic, or the like and can be used for applications requiring complete enclosure, such as during fluid immersions, without affecting the performance of the apparatus 100.

Figure 5:
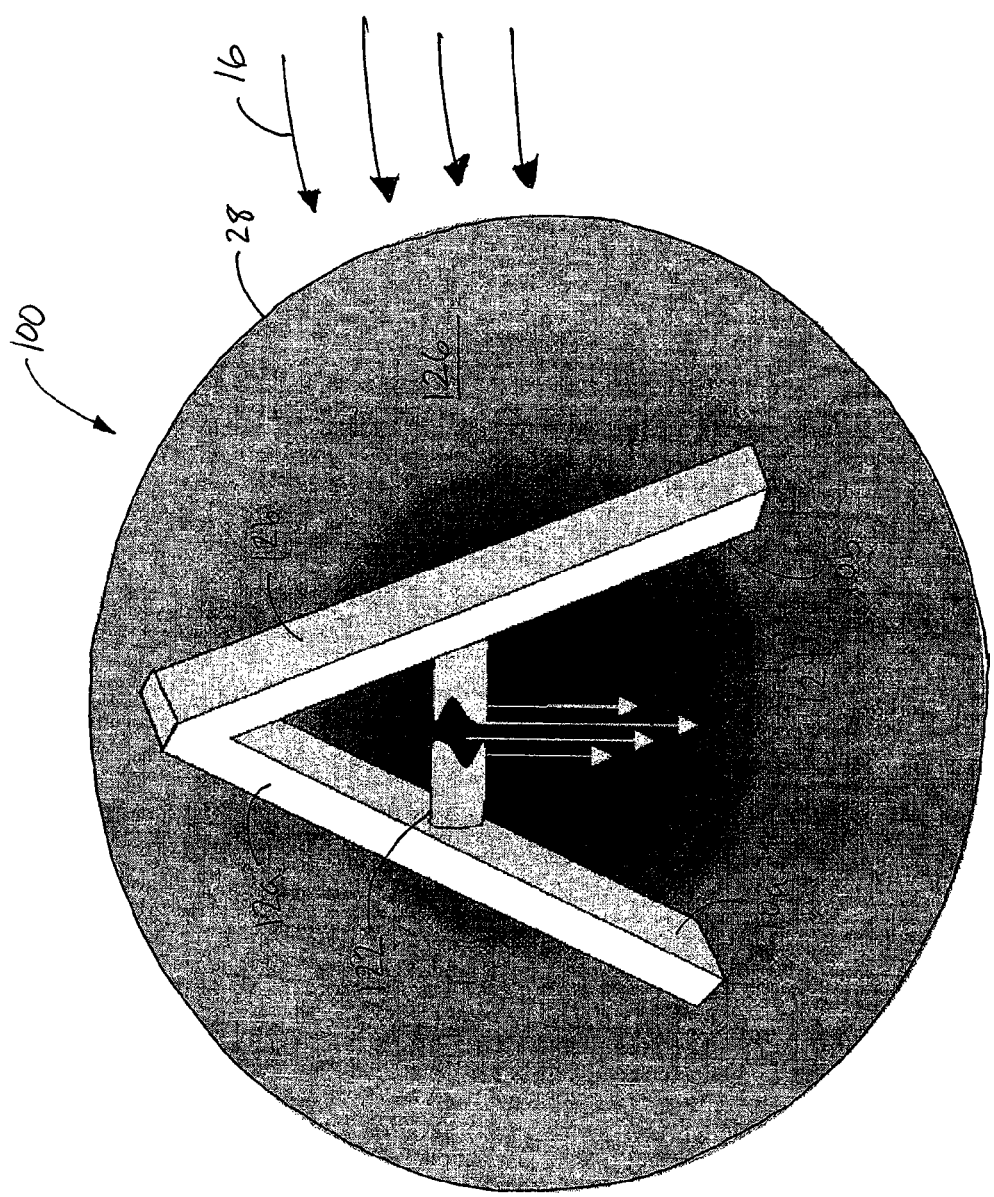
FIG. 5 is an enlarged perspective view of the static detecting apparatus of FIG. 4 following a rupturing of the indicator.

The indicator 122, shown in FIG. 4 as a capsule, may include an encapsulated material 124 that is releasable from the indicator 122 upon rupture. The capsule 122 may be made from a thin, fragile plastic or other suitable material. The capsule 122 is preferably coupled to the surfaces 10a, 10b using a strong adhesive (not shown), or may be welded to the surfaces 10a, 10b. The encapsulated material 124 is preferably a dye, but may also be an ink, gel, powder, or the like. The apparatus 100 also preferably includes a surrounding medium 126 that receives the encapsulated material 124 released by the ruptured indicator 122. The surrounding medium 126 preferably undergoes a visible color change upon receipt of the encapsulated material 124. For example, the surrounding medium 126 may be a blotting paper or fabric that absorbs the released dye 124, as shown in FIG. 5. The visible color change in FIG. 5 is most concentrated at the center, but more diffuse at edge regions of the apparatus 100, although over time the visible color change of the surrounding medium 126 may become more uniform. The surrounding medium 126 may also be a liquid that undergoes a visible color change as the encapsulated material 124 becomes mixed with the liquid. Alternatively, the surrounding medium 126 may be air or another gas that does not visibly change color. In certain embodiments, the encapsulated material 124 may visibly change color upon exposure to the surrounding medium 126.

Figure 6:
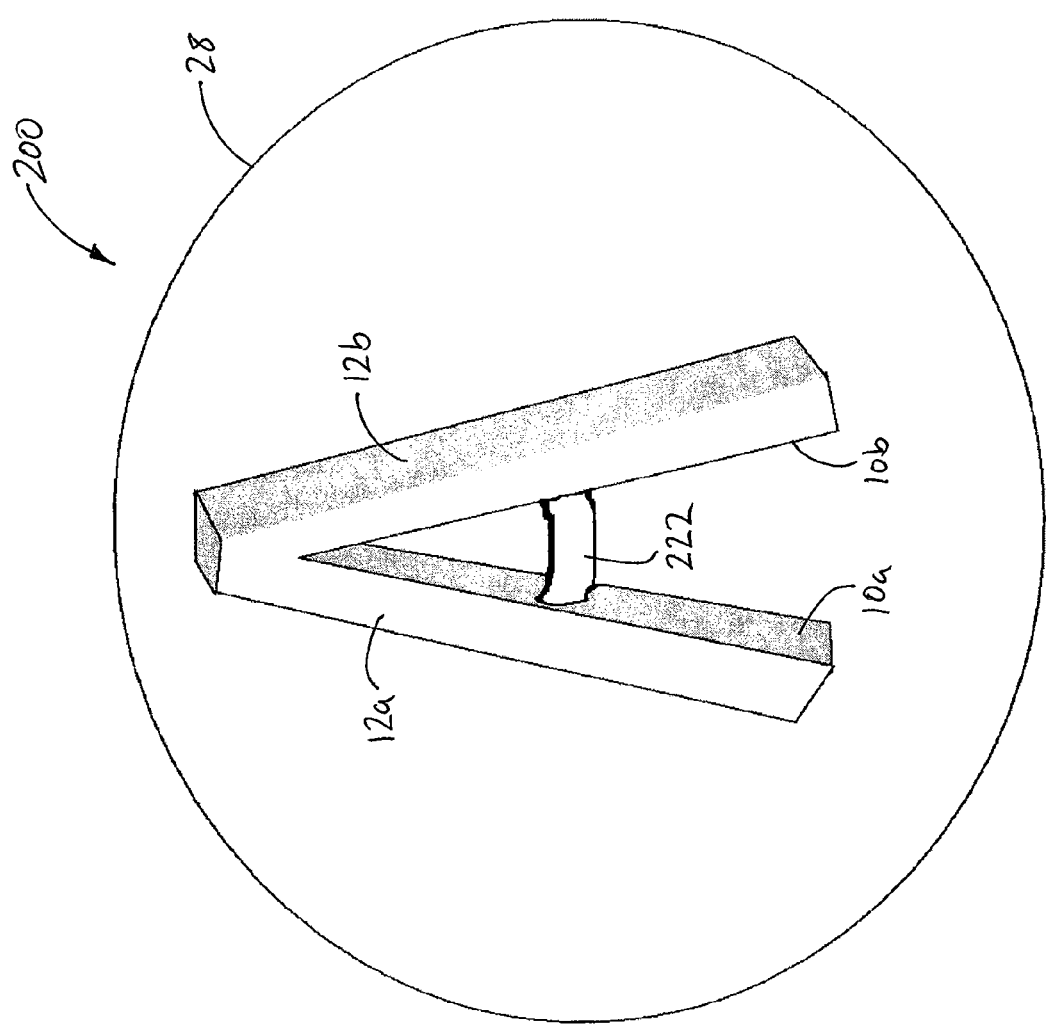
FIG. 6 is an enlarged perspective view of a static detecting apparatus having a rupturable adhesive indicator in accordance with another preferred embodiment of the present invention.
Figure 7:
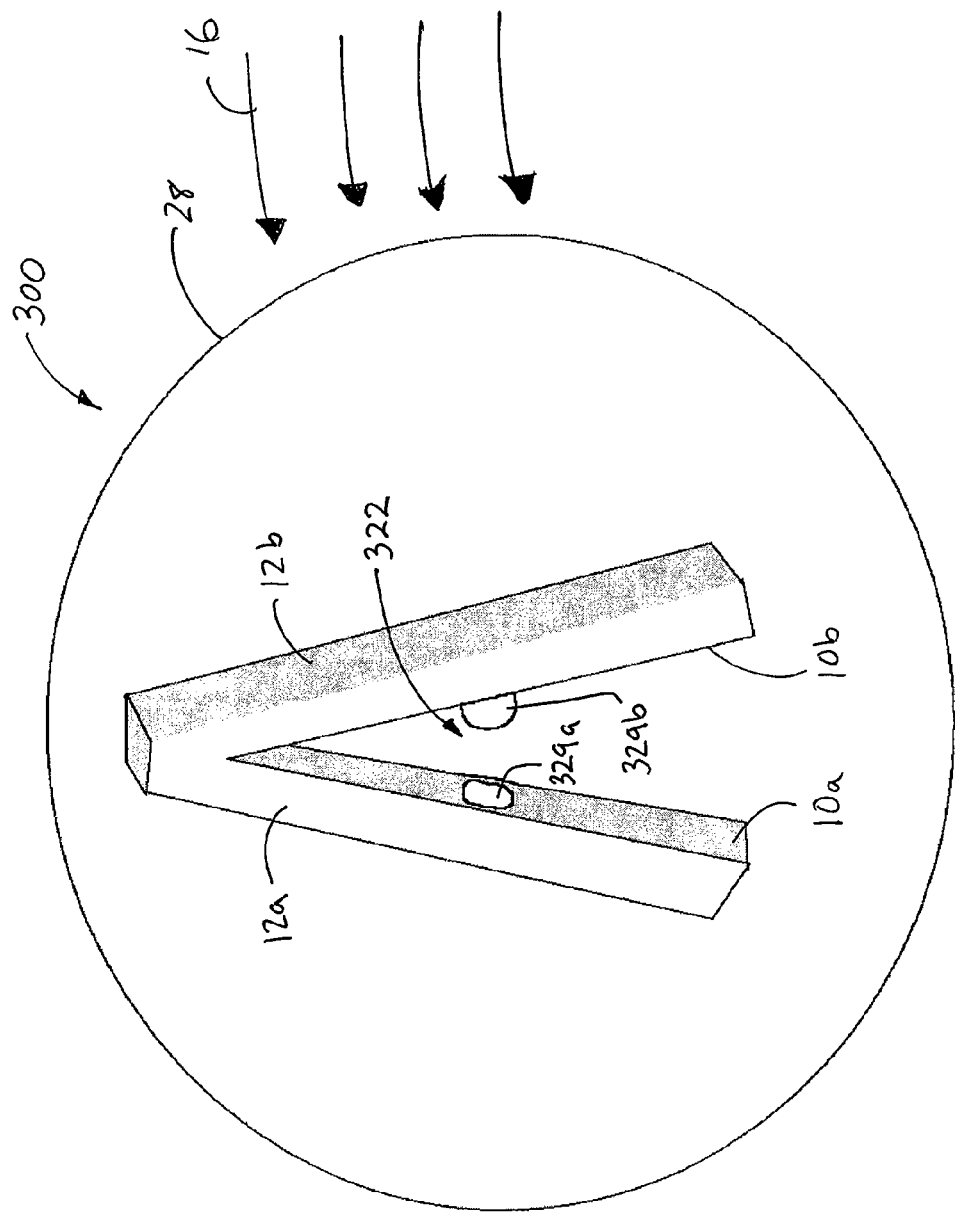
FIG. 7 is an enlarged perspective view of a static detecting apparatus having a rupturable dimple weld indicator in accordance with another preferred embodiment of the present invention.

In an alternate embodiment, shown in FIG. 6, the rupturable indicator 222 of the apparatus 200 is a bead of adhesive which may break apart or separate from one or both of the surfaces 10a, 10b upon repulsion of the surfaces 10a, 10b by a predetermined distance. The adhesive bead 222 is preferably visually inspected for damage following use, such as under a microscope or by direct observation. In a further alternate embodiment, shown in FIG. 7, the rupturable indicator 322 of the apparatus 300 may be a dimple weld including, for example, a concavity 329a and a protrusion 329b. The protrusion 329b is initially disposed within the concavity 329a, but repulsion of the surfaces 10a, 10b by a predetermined distance separates the protrusion 329b from the concavity 329a, as shown in FIG. 7. The fit between the concavity 329a and the protrusion 329b is constructed such that the protrusion 329b cannot reenter the concavity 329a upon a return of the surfaces 10a, 10b to the initial adjacent position.

Figure 8:
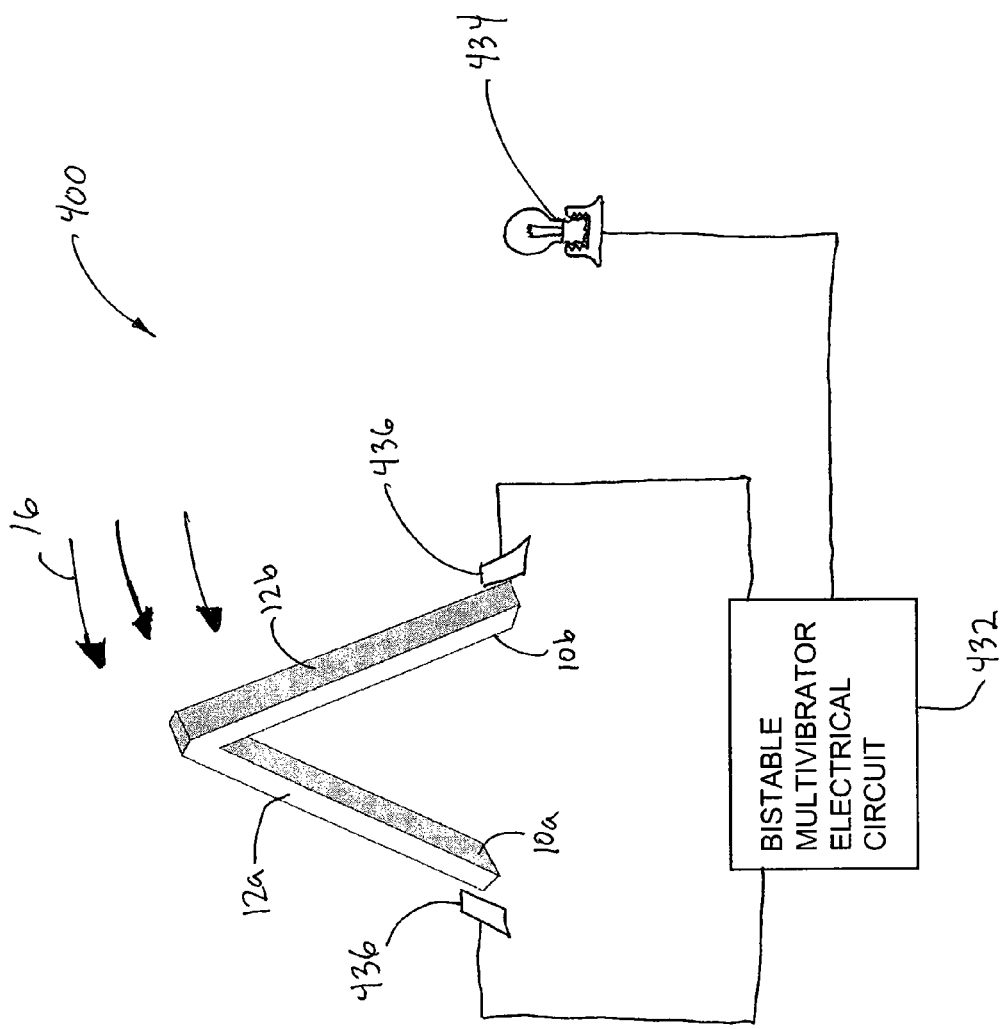
FIG. 8 is a schematic view of a static detecting apparatus having a bistable multivibrator electrical circuit and an indicator in accordance with another preferred embodiment of the present invention.

FIG. 8 illustrates an apparatus 400 for detecting a static field 16 in accordance with certain other preferred embodiments of the present invention. The apparatus 400 includes a sensor 432 that detects repulsion of the two surfaces 10a, 10b from each other by at least a predetermined distance. The apparatus 400 further includes an indicator 434 coupled to an output of the sensor 432. The indicator 434 communicates that repulsion of the two surfaces 10a, 10b has exceeded the predetermined distance.

In FIG. 8, the sensor 432 is illustrated as a conventional bistable multivibrator electrical circuit and the indicator 434 is a light. Other indicators 434 may also be used, such as, for example, audible alarms, electrical signals, or wireless signals. Preferably, the light 434 is initially off, but may also initially be on. Once the two surfaces 10a, 10b repulse one another by a predetermined distance, the bistable multivibrator electrical circuit 432 changes states, which thereafter triggers a change in the light 434. The light 434, which preferably was initially off, turns on. With the light 434 on, a user is now aware that the apparatus 400 was subjected to at least a threshold level of a static field 16.

The bistable multivibrator electrical circuit 432 preferably includes at least one trigger 436 for actuation by one or more of the surfaces 10a, 10b or beams 12a, 12b. For example, the apparatus 400 may include two triggers 436 that are contact pads set apart at the predetermined distance. Repulsion of the surfaces 10a, 10b may then cause the beams 12a, 12b to touch the contact pads 436 to conduct electricity to the bistable multivibrator electrical circuit 432. The trigger 436 may also be a mechanical switch, a capacitor, or the like. Preferably, subsequent repulsion of the two surfaces 10a, 10b by a predetermined distance does not change the state of the sensor 432 or the indicator 434.

Similar to the embodiments shown in FIGS. 4-7, the surfaces 10a, 10b, the sensor 432, and the indicator 434 may all be contained within a clear insulative cover 28, but it is also envisioned that individual components, particularly the indicator 434, may be external or separate and apart from at least the surfaces 10a, 10b.

Figure 9:
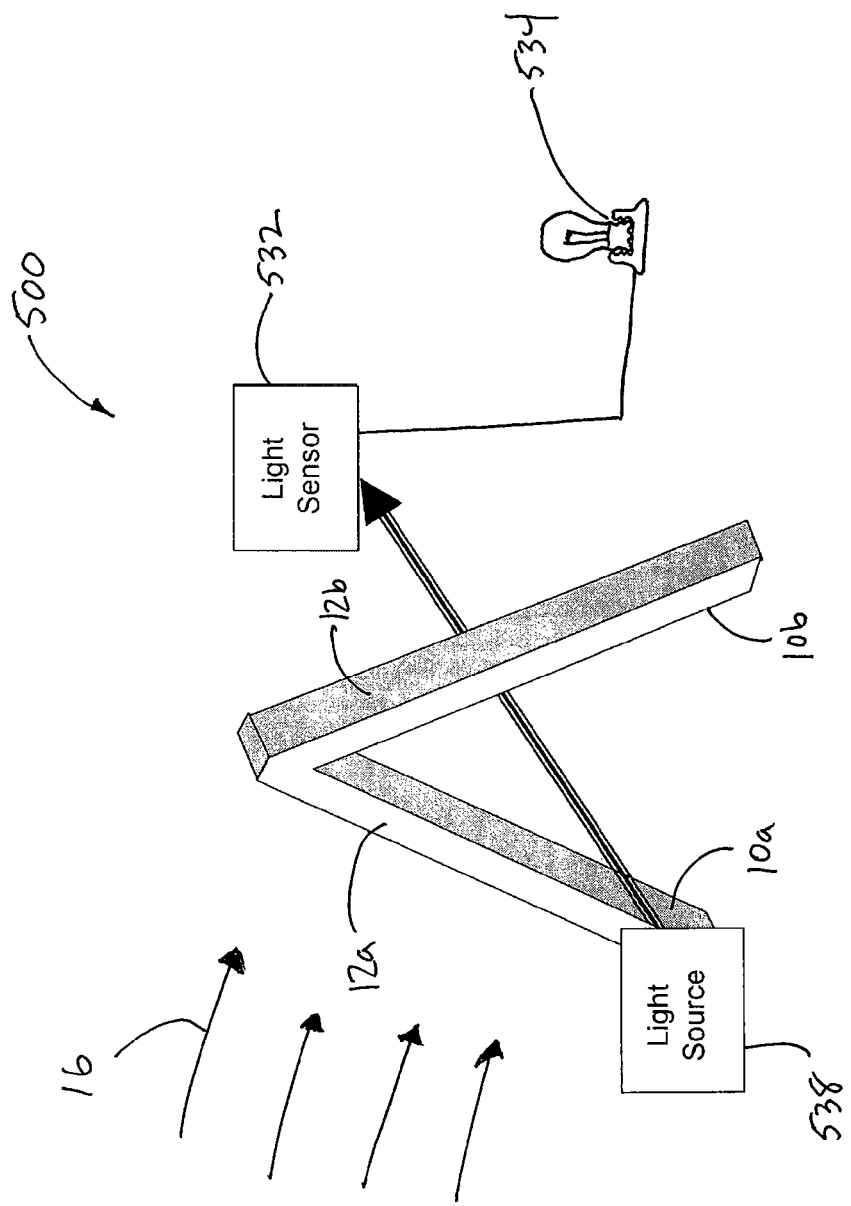
FIG. 9 is a schematic view of a static detecting apparatus having an optical sensor and an indicator in accordance with another preferred embodiment of the present invention.

In an alternate embodiment, shown in FIG. 9, sensor 532 of apparatus 500 is an optical sensor. For example, a light source 538 may be optically coupled with the sensor 532. The light source 538 may initially be blocked by the surfaces 10a, 10b and/or beams 12a, 12b, and upon repulsion of the surfaces 10a, 10b from each other by a predetermined distance, the light source 538 is exposed to the sensor 532, triggering an indicator 534, which may be a light. Alternatively, during repulsion by the surfaces 10a, 10b by a predetermined distance, one of the surfaces 10a, 10b and/or beams 12a, 12b may block the light source 538 from the sensor 532, triggering the indicator 534. As before, subsequent repulsion of the two surfaces 10a, 10b by a predetermined distance preferably does not change the state of the sensor 532 or the indicator 534.

Figure 10:
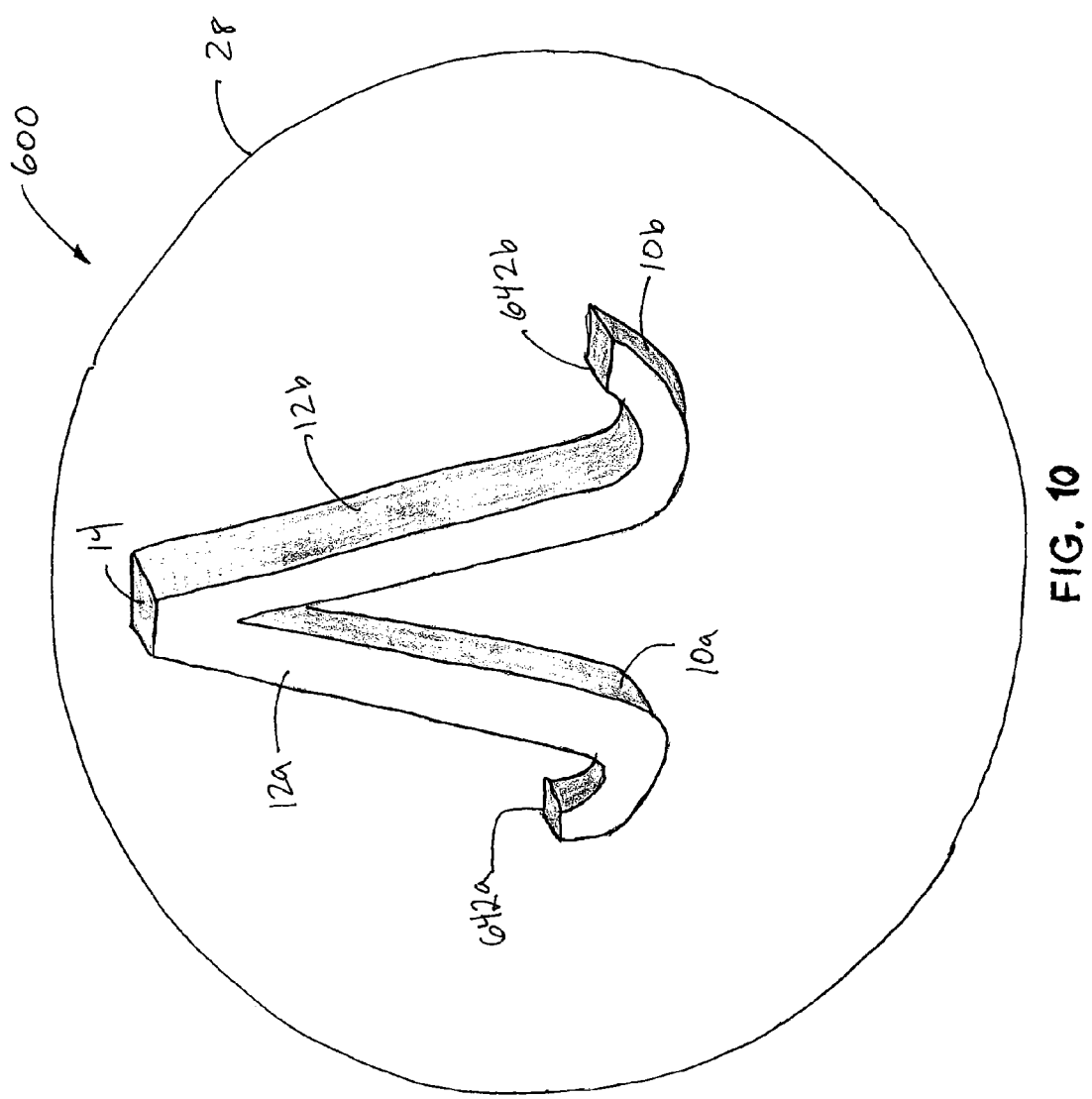
FIG. 10 is an enlarged perspective view of a static detecting apparatus wherein the surfaces exhibit a permanent bending in accordance with another preferred embodiment of the present invention.

FIG. 10 illustrates an apparatus 600 for detecting a static field 16 in accordance with another preferred embodiment of the present invention. The surfaces 10a, 10b and/or beams 12a, 12b have a deformation property such that stress caused by repulsion of the two surfaces 10a, 10b from each other by at least a predetermined distance causes at least one of the surfaces 10a, 10b and/or beams 12a, 12b to permanently deform. That is, the surfaces 10a, 10b do not completely return to be adjacent to one another as the surfaces 10a, 10b had been prior to exposure to the static field 16, as shown in FIG. 2. For example, the conductive material may have a degree of plasticity such that the stress caused by repulsion of the two surfaces 10, 10b from each other by at least a predetermined distance causes at least one of the surfaces 10a, 10b to bend permanently. In FIG. 10, ends of the surfaces 10a, 10b opposite to the common end 14 exhibit outward curl deformations 642a, 642b. The curls 642a, 642b provide a visual indication that the surfaces 10a, 10b have experienced at least a threshold level of a static field 16. At the dimensions of 1 inch by 0.25 inches by 0.001 inches described above, surfaces 10a, 10b made of aluminum exhibit clearly visible curl deformations 642a, 642b, unlike tin surfaces 10a, 10b having identical dimensions.

Figure 11:
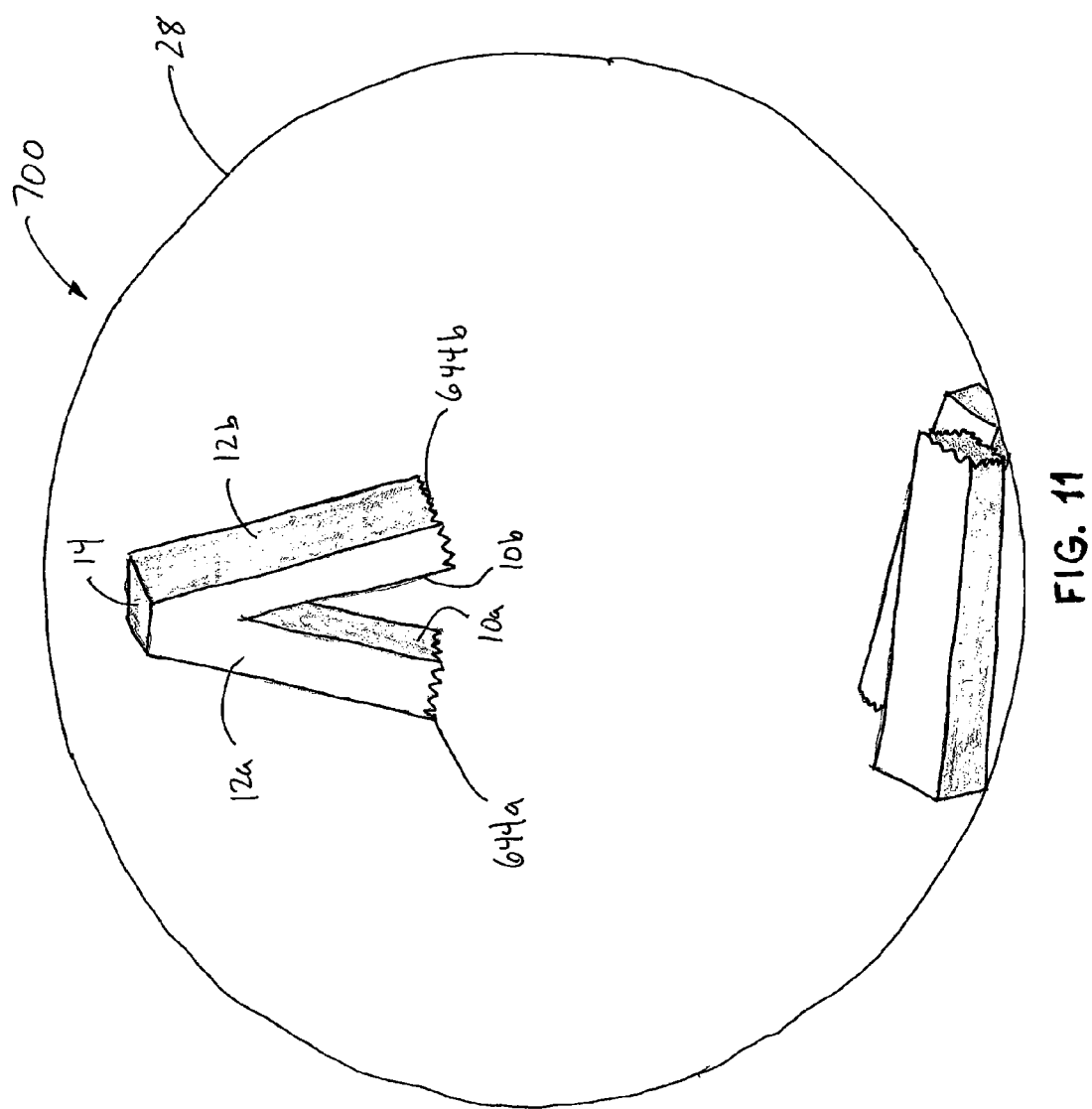
FIG. 11 is an enlarged perspective view of a static detecting apparatus wherein the surfaces have fractured in accordance with another preferred embodiment of the present invention.

In an alternate embodiment, shown in FIG. 11, the surfaces 10a, 10b and/or beams 12a, 12b of apparatus 700 include a conductive material having a fracture point such that the stress caused by repulsion of the two surfaces 10, 10b from each other by at least a predetermined distance causes at least one of the surfaces 10a, 10b to fracture. In FIG. 11, ends of the surfaces 10a, 10b opposite to the common end 14 are broken off, leaving fractured ends 744a, 744b, indicating that the surfaces 10a, 10b have experienced at least a threshold level of a static field 16. For example, the beams 12a, 12b may be constructed from an extremely brittle material, such as thin quartz or glass, having a conductive coating forming the conductive surfaces 10a, 10b.

Detection of the deformation of the surfaces 10a, 10b preferably occurs by visual inspection, either directly or using magnification. However, other methods may be used, such as optical sensors or electrical sensors.

Figure 12:
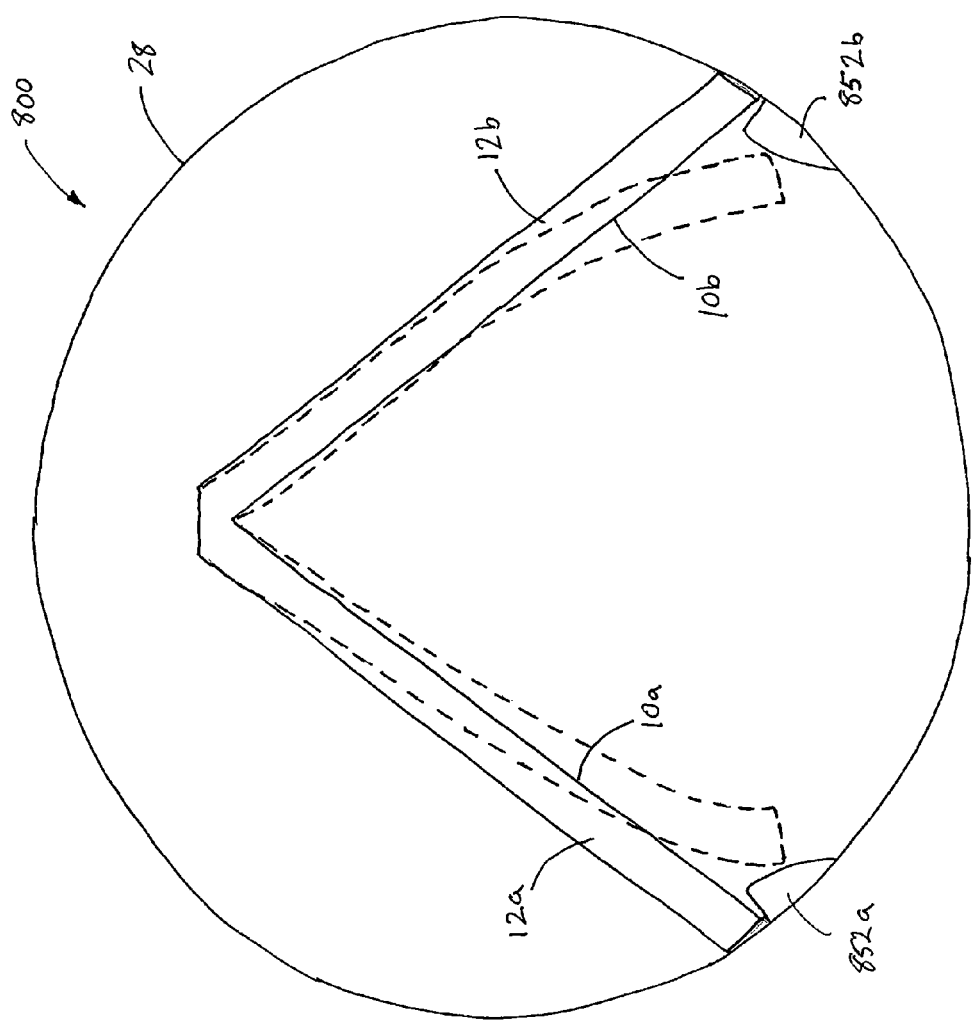
FIG. 12 is an enlarged side elevational view of a static detecting apparatus having stoppers in accordance with another preferred embodiment of the present invention.

FIG. 12 illustrates an apparatus 800 for detecting a static field 16 in accordance with another preferred embodiment of the present invention. In previous embodiments, at least one of the surfaces 10a, 10b has a movement path resulting from the repulsion of the two surfaces 10a, 10b from each other. That is, the surfaces 10a, 10b tend to move away from the rest position (e.g., FIG. 2) when in the presence of a static field 16. The apparatus 800 includes at least one stopper 852a in the movement path of at least one of the surfaces 10a. Preferably, a stopper 852a, 852b is located in each respective movement path of the two surfaces 10a, 10b. The stoppers 852a are "one-way stoppers" and prevent the respective surfaces 10a, 10b from returning to the rest position after the two surfaces 10a, 10b are repulsed from each other by at least a predetermined distance.

In preferred embodiments, the stoppers 852a, 852b may be protrusions placed at the predetermined distance. The stoppers 852a, 852b should therefore be shaped to allow the surfaces 10a, 10b to traverse the stoppers 852a, 852b during repulsion, but prevent the surfaces 10a, 10b from traversing back to the rest position. For example, the surfaces 10a, 10b and beams 12a, 12b are shown in phantom in FIG. 12 when bending to traverse the respective stoppers 852a, 852b during repulsion. Alternatively, the stoppers 852a, 852b may be one-way retractable, hinged, flexible, spring-loaded, or the like.

Figure 13:
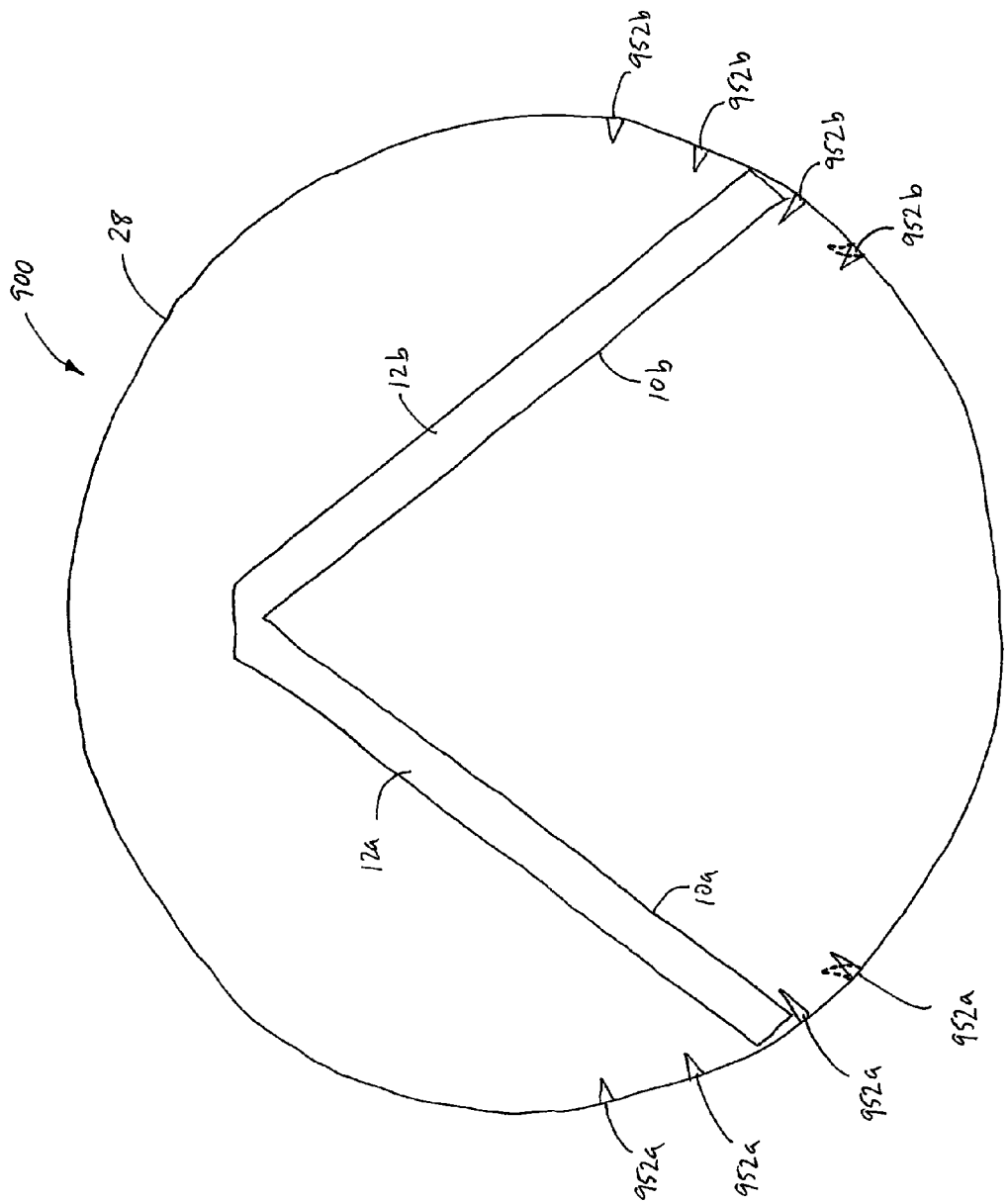
FIG. 13 is an enlarged side elevational view of a static detecting apparatus having a plurality of incrementally spaced apart stoppers in accordance with another preferred embodiment of the present invention.

Apparatus 900 (FIG. 13) may also include a plurality of stoppers 952a, 952b in the movement paths of the respective surfaces 10a, 10b. The location of each of the stoppers 952a, 952b may be proportional to the strength of the static field 16 experienced by the two surfaces 10a, 10b. For example, the lowest stopper 952a may correspond to a field strength of 20 kV, the next stopper 952a may correspond to 30 kV, and so on. In the example of FIG. 13, the stoppers 952a, 952b are shown in phantom when bending to allow passage of the surfaces 10a, 10b during repulsion.

Figure 14:
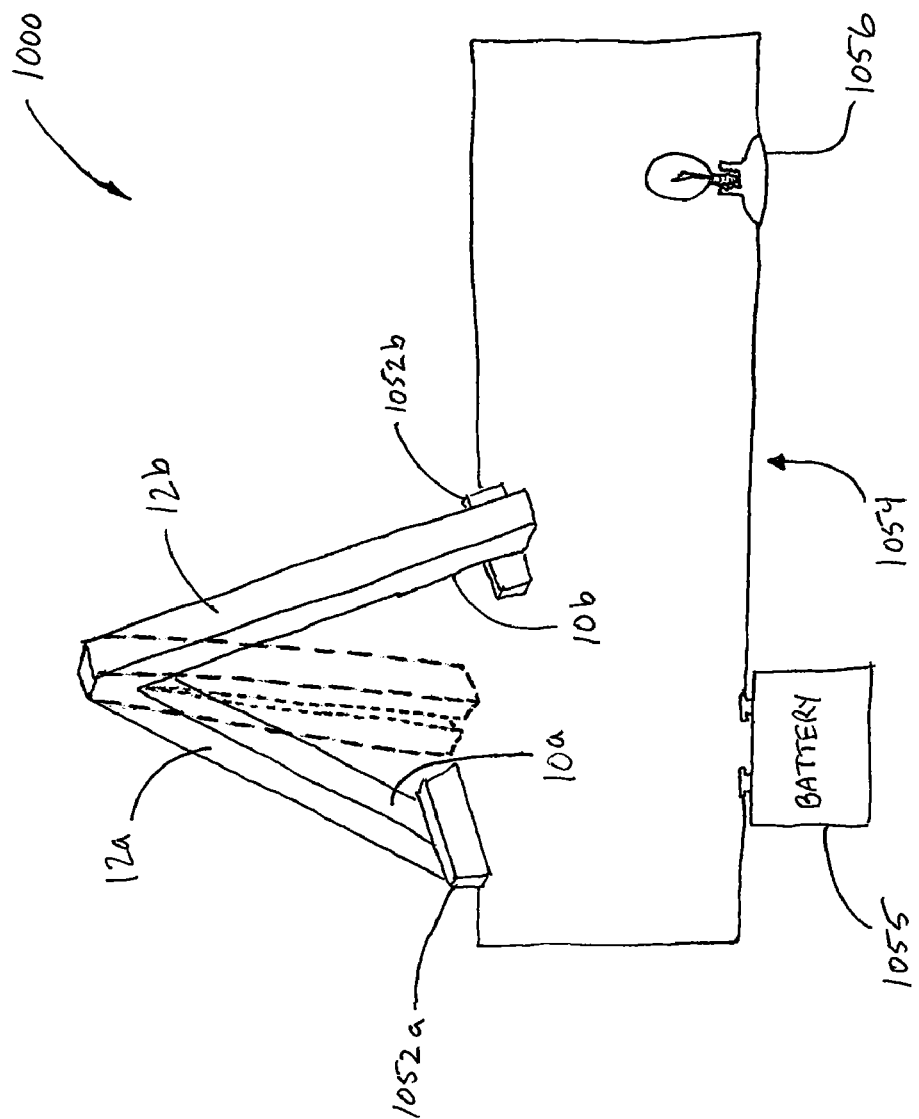
FIG. 14 is a schematic view of a static detecting apparatus having stoppers coupled to an electric circuit and an indicator in accordance with another preferred embodiment of the present invention.

While the indication of repulsion of the two surfaces 10a, 10b is preferably directly observed, other indication techniques are available. For example, in FIG. 14, apparatus 1000 includes an electric circuit 1054 electrically coupled to a battery 1055 and an indicator 1056. The indicator 1056 is preferably a light. The stoppers 1052a, 1052b may be contact pads that are electrically coupled to the circuit 1054. The surfaces 10a, 10b are shown in the rest position in phantom. Contact between the stoppers 1052a, 1052b and the respective surfaces 10a, 10b completes the electric circuit 1054, thereby enabling electricity to flow through from the battery 1055 to the indicator 1056. Contacts for the electric circuit 1054 may also be separate from the stoppers 1052a, 1052b. Alternatively, the repulsed surfaces 10a, 10b may break, rather than enable, the electric circuit 1054.

Figure 15:
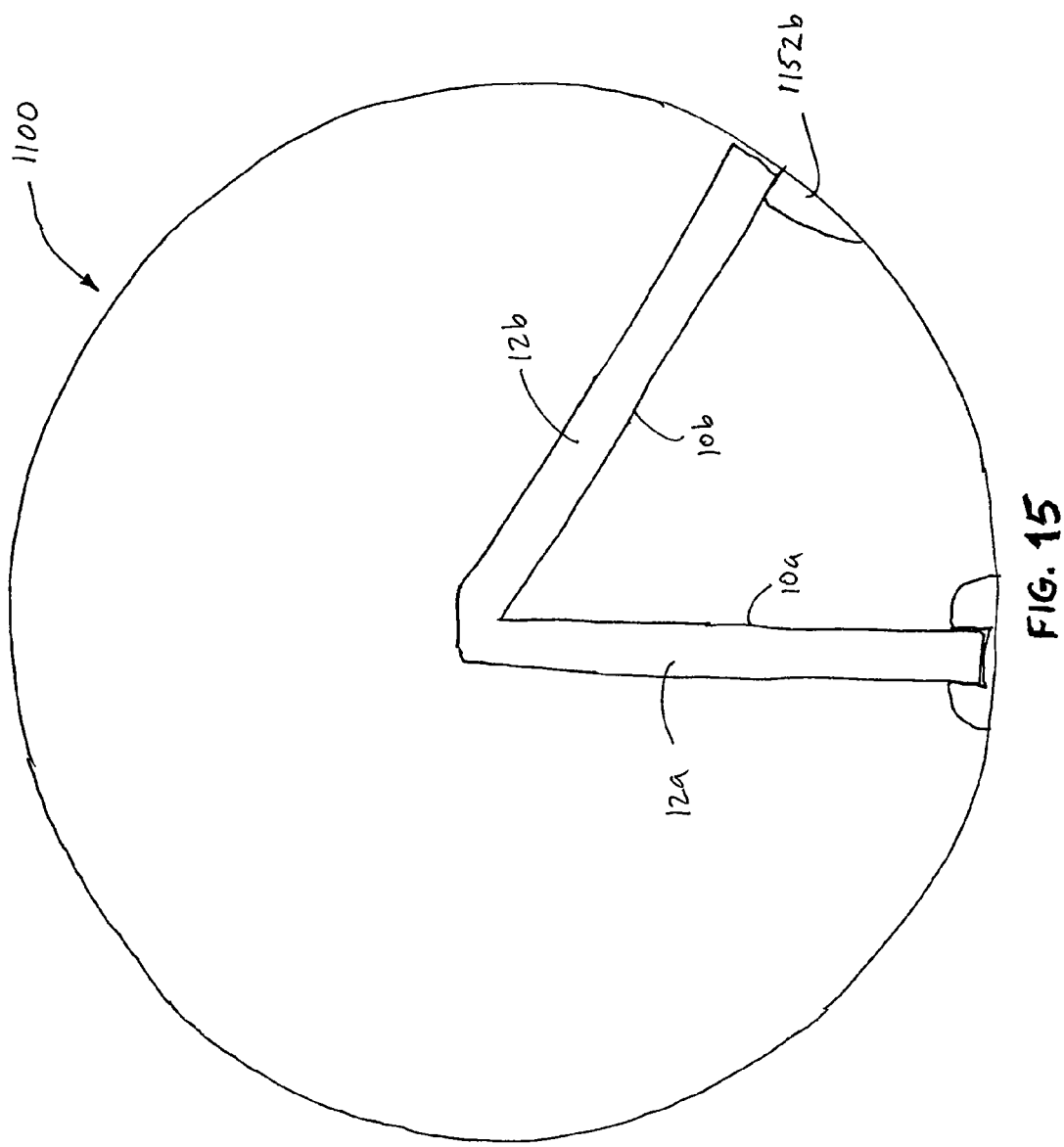
FIG. 15 is an enlarged side elevational view of a static detecting apparatus wherein one of the surfaces is fixed in accordance with another preferred embodiment of the present invention.

In certain embodiments, it may be desirable to permit motion by only one of the surfaces 10a, 10b. For example, apparatus 1100 in FIG. 15 fixes surface 10a while the other surface 10b is free to move during repulsion in the presence of the static field 16. The stopper 1152b prevents the other surface 10b from returning to the rest position. The fixing of one of the surfaces 10a, 10b may also be applicable to many of the other embodiments described herein.

Figure 16:
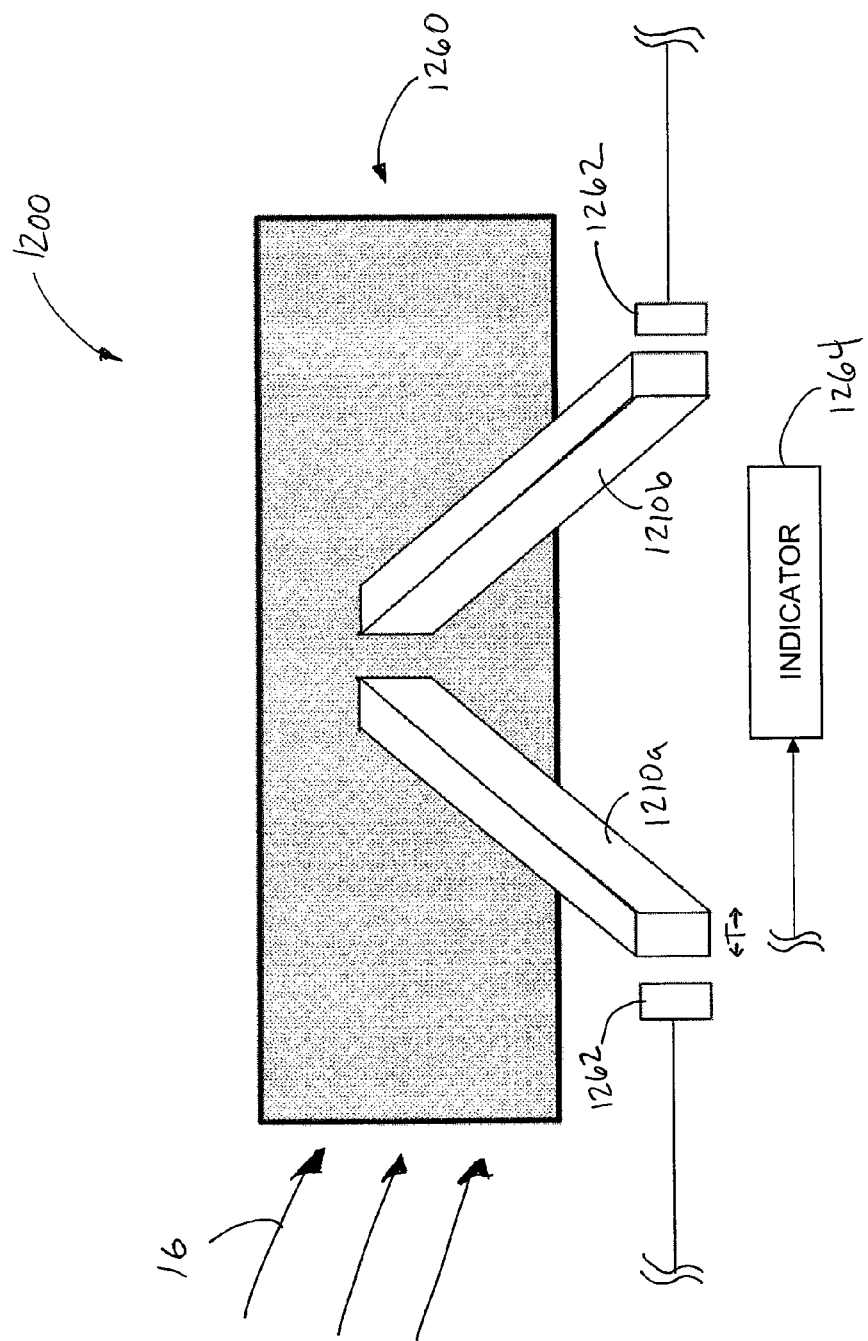
FIG. 16 is a schematic view of a static detecting apparatus having a MEMS device with two cantilevered beams in accordance with another preferred embodiment of the present invention.
Figure 17:
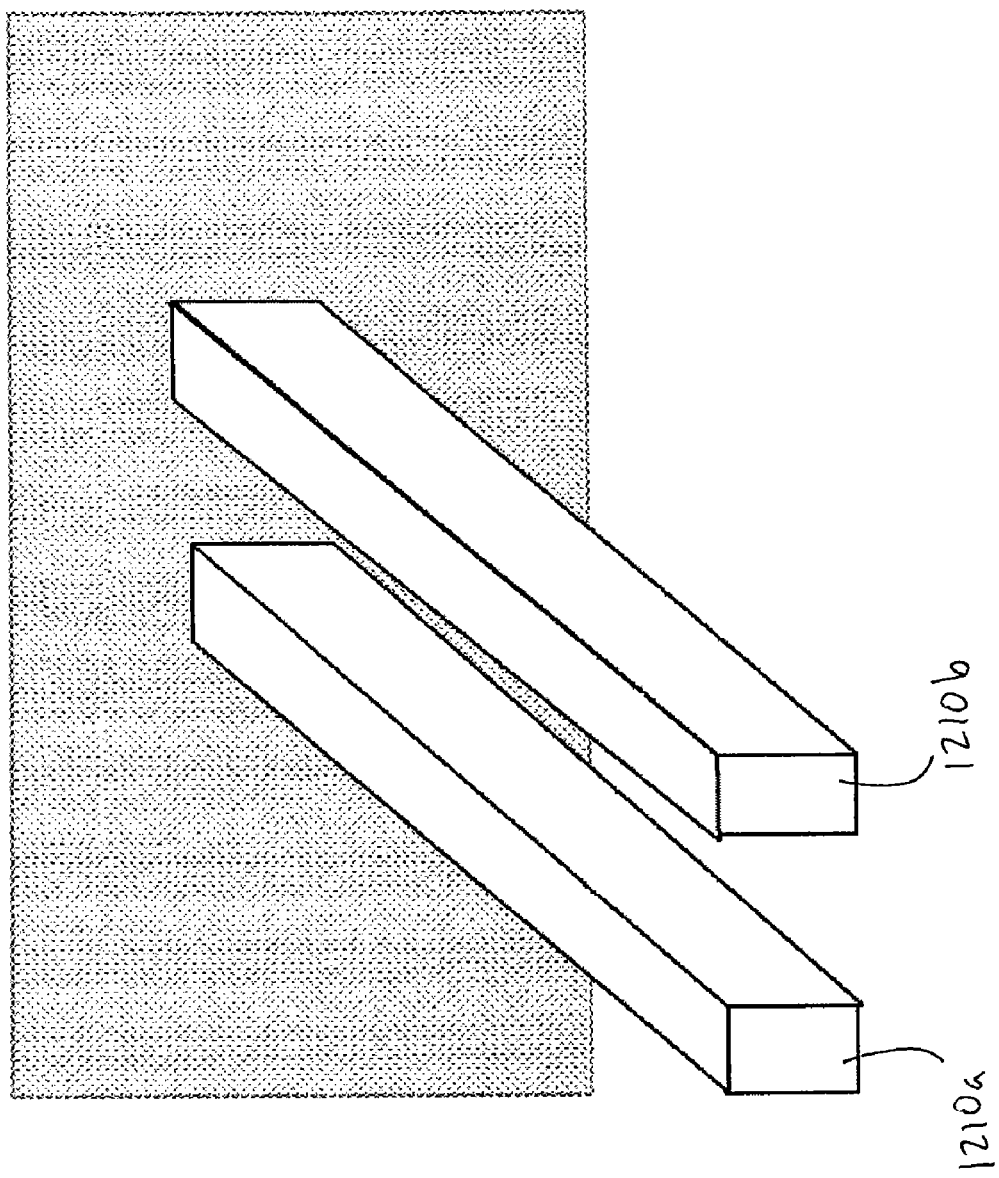
FIG. 17 is an enlarged perspective view of the static detecting apparatus of FIG. 16 wherein the cantilevered beams are adjacent and substantially parallel to one another in a rest position.

FIG. 16 illustrates an apparatus 1200 for detecting a static field 16 in accordance with another preferred embodiment of the present invention. The apparatus 1200 includes a microelectromechanical systems (MEMS) device 1260 having two cantilevered beams 1210a, 1210b of conductive material, which is preferably a doped semiconductor material such as silicon or germanium. The cantilevered beams 1210a, 1210b can be very small, preferably having a thickness T of 100 nanometers (nm) or less. In the absence of a static field (rest position), the two cantilevered beams 1210a, 1210b are adjacent and substantially parallel to each other (FIG. 17). In the presence of a static field 16, the two cantilevered beams 1210a, 1210b repel each other (FIG. 16). The apparatus 1200 further includes at least one sensor 1262 that detects an amount of repulsion of the two cantilevered beams 1210a, 1210b from each other.

The MEMS device 1260 may use conventional circuitry (not shown) for determining position of the cantilevered beams 1210a, 1210b. The sensors 1262 are preferably capacitors, but may also be optical sensors or the like. The sensors 1262 detect displacement of the cantilevered beams 1210a, 1210b from the rest position, which is used to calculate the repulsion of the cantilevered beams 1210a, 1210b from one another. A simple example of an algorithm for determining the repulsion of the cantilevered beams 1210a, 1210b from each other is shown by Table 1 below.

TABLE 1

| Measured Beam 1210a Displacement from Rest Position (Units) | Measured Beam 1210b Displacement from Rest Position (Units) | Repulsion of Beams 1210a, 1210b from Rest Position (Units) |
| --- | --- | --- |
| 1 | 1 | 2 |
| 2 | 2 | 4 |
| 3 | 3 | 6 |
| 4 | 4 | 8 |
| 5 | 5 | 10 |

The measured displacements of each of the respective cantilevered beams 1210a, 1210b may be summed to attain the repulsion value. It follows from Table 1 that non-repulsive movement of at least one of the cantilevered beams 1210a, 1210b, as a result of vibrations or other motion, results in a negative displacement value for at least one of the cantilevered beams 1210a, 1210b. In order to prevent false readings of repulsion resulting such motion, the apparatus 1200 may be programmed to ignore negative displacements so that only repulsion (positive displacement by both cantilevered beams 1210a, 1210b) is reported.

The sensors 1262 may continuously determine the amount of repulsion of the two cantilevered beams 1210a, 1210b from each other, or may determine only whether the amount of the repulsion of the two cantilevered beams 1210a, 1210b is greater than a predetermined distance.

The apparatus 1200 further includes an indicator 1264 connected to an output of the sensor 1262. When the sensor 1262 continuously determines the amount of repulsion of the cantilevered beams 1210a, 1210b, the indicator 1264 communicates a maximum amount of repulsion of the two cantilevered beams 1210a, 1210b. The amount is preferably converted to a value representing the strength of the static field 16. When the sensor 1262 determines only whether the amount of repulsion of the cantilevered beams 1210a, 1210b is greater than a predetermined distance, the indicator 1264 communicates whether the amount of repulsion of the two cantilevered beams 1210a, 1210b exceeded the predetermined distance. The indicator 1264 may be a light, alphanumeric characters, a memory that is read out by a user, or the like. Additionally, the sensing and indication may be implemented in software. When the apparatus 1200 is used within finished equipment (e.g., a chip in a computer) (not shown), the MEMS device 1260 may be communicatively coupled to the equipment for self-monitoring. The indicator 1264 is also preferably resettable to allow the apparatus 1200 to be reused.

Figure 18:
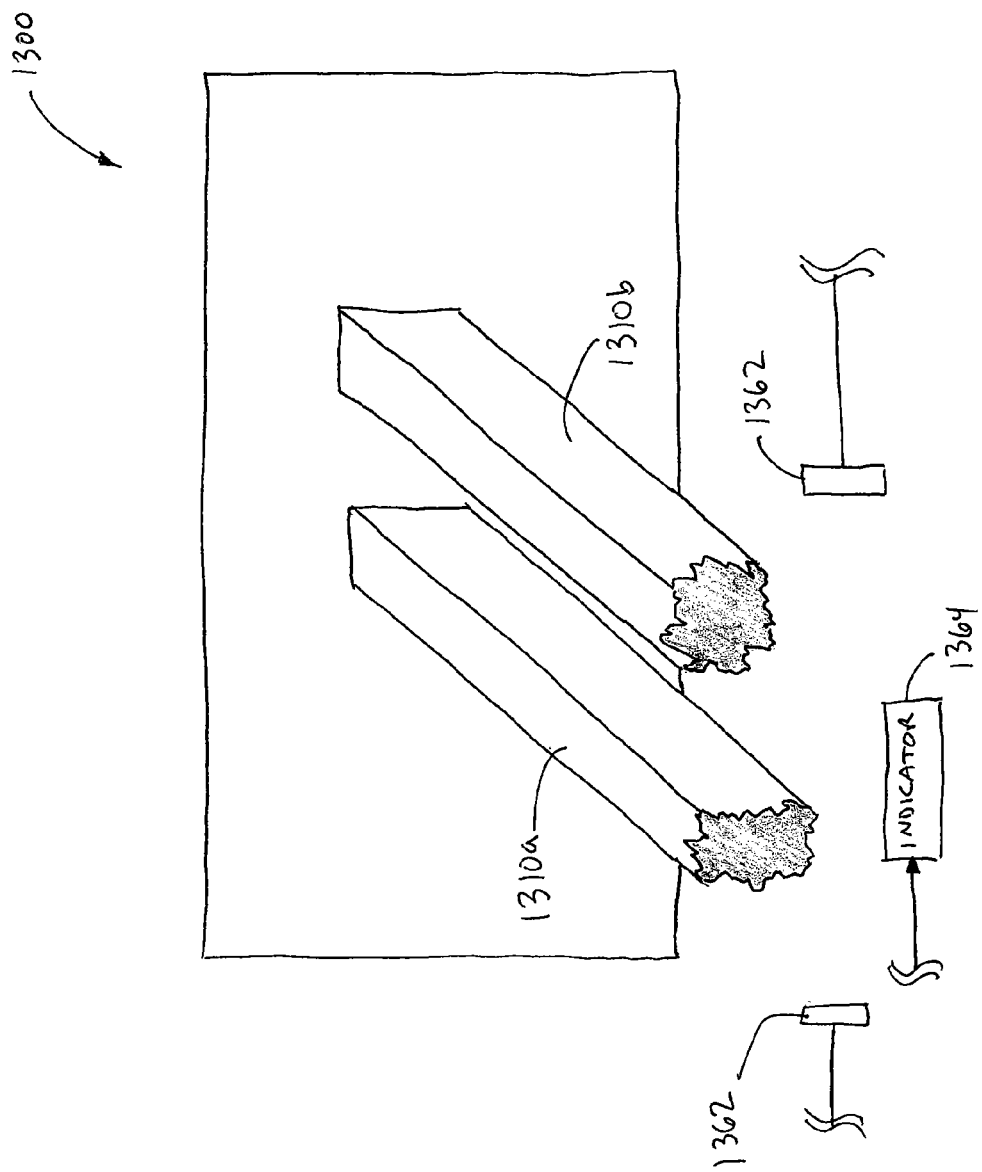
FIG. 18 is a schematic view of the static detecting apparatus of FIG. 16 wherein the cantilevered beams are fractured.

In an alternate embodiment, apparatus 1300 shown in FIG. 18 includes two frangible cantilevered beams 1310a, 1310b. At least one of the two frangible cantilevered beams 1310a, 1310b fractures upon a repulsion of the two beams 1310a, 1310b from each other by at least a predetermined distance. Fracture may occur at any portion of the respective two beams 1310a, 1310b. The apparatus 1300 further includes at least one sensor 1362 to detect a fracturing of at least one of the two beams 1310a, 1310b. An indicator 1364, similar to those described above, may be used to indicate when fracture of the beams 1310a, 1310b has occurred.

Use of the embodiments of the present invention detailed above will now be described. For simplicity, all embodiments hereinafter will be referred to as static detector 2000.

Figure 19:
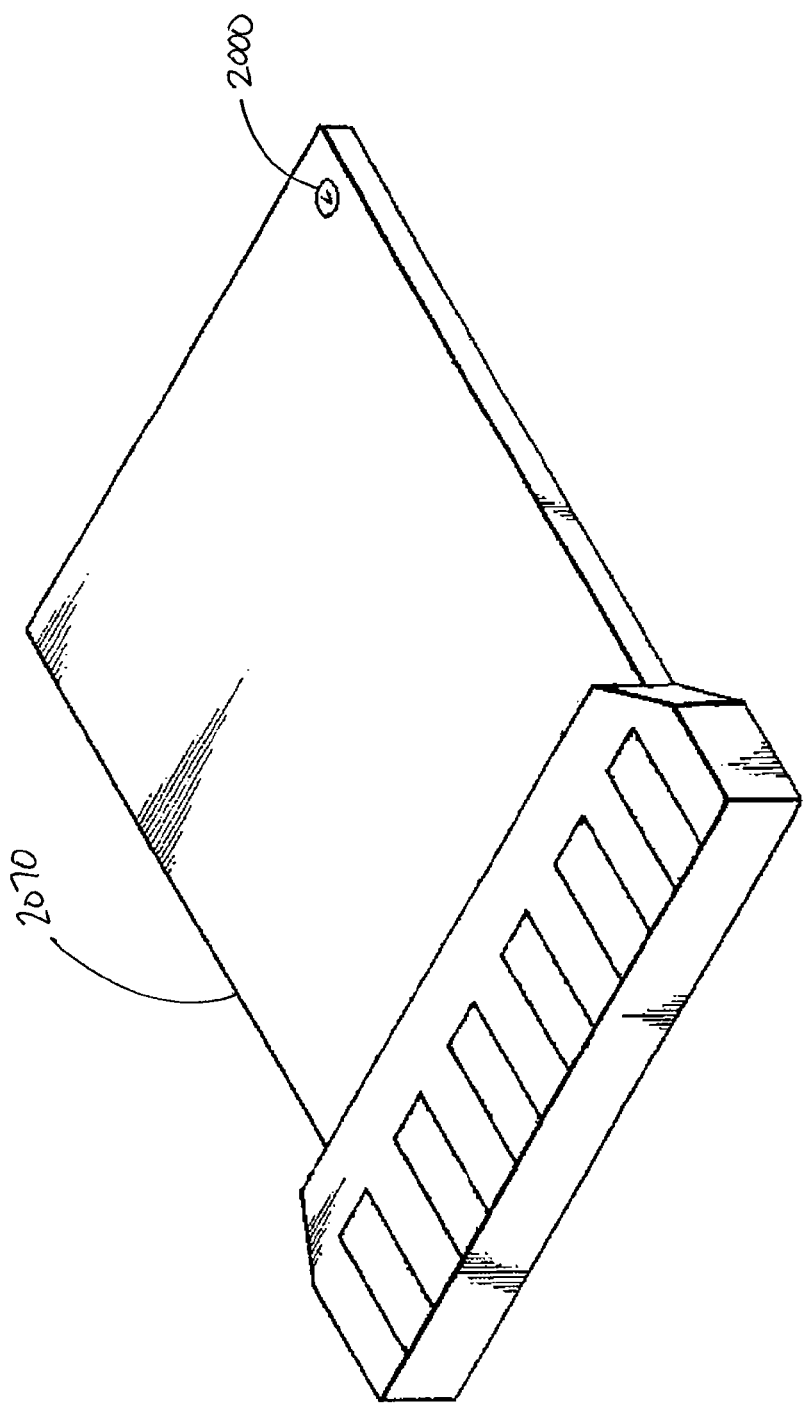
FIG. 19 is an enlarged perspective view of a printed circuit board having a static detecting apparatus mounted thereto in accordance with preferred embodiments of the present invention.

FIG. 19 illustrates one of the preferred uses of the static detector 2000. A printed circuit board (PCB) 2070 is shown having the static detector 2000 disposed thereon. The static detector 2000 is preferably adhered or fastened to the PCB 2070. The static detector 2000 is preferably attached to the PCB 2070 prior to manufacturing or assembly of the PCB 2070, permitting examination of potentially damaging static fields 16 at each stage. This is particularly useful in determining ESD "hot spots" within manufacturing equipment and permits monitoring of compliance with S20.20 standards.

The size of the static detector 2000 may be adjusted to suit the size of the PCB 2070. It is even contemplated to enable a static detector 2000 to be placed on a single lead (not shown) on the PCB 2070, for independent monitoring of the most sensitive component thereon. Placement of the static detector 2000 is not limited to PCBs 2070, but may be placed on all kinds of ESD sensitive devices during manufacture, such as integrated circuits (ICs), wafers and chips. The static detectors 2000 may also be placed within the manufacturing equipment for monitoring, although placement on the PCB 2070 is preferred.

Figure 20:
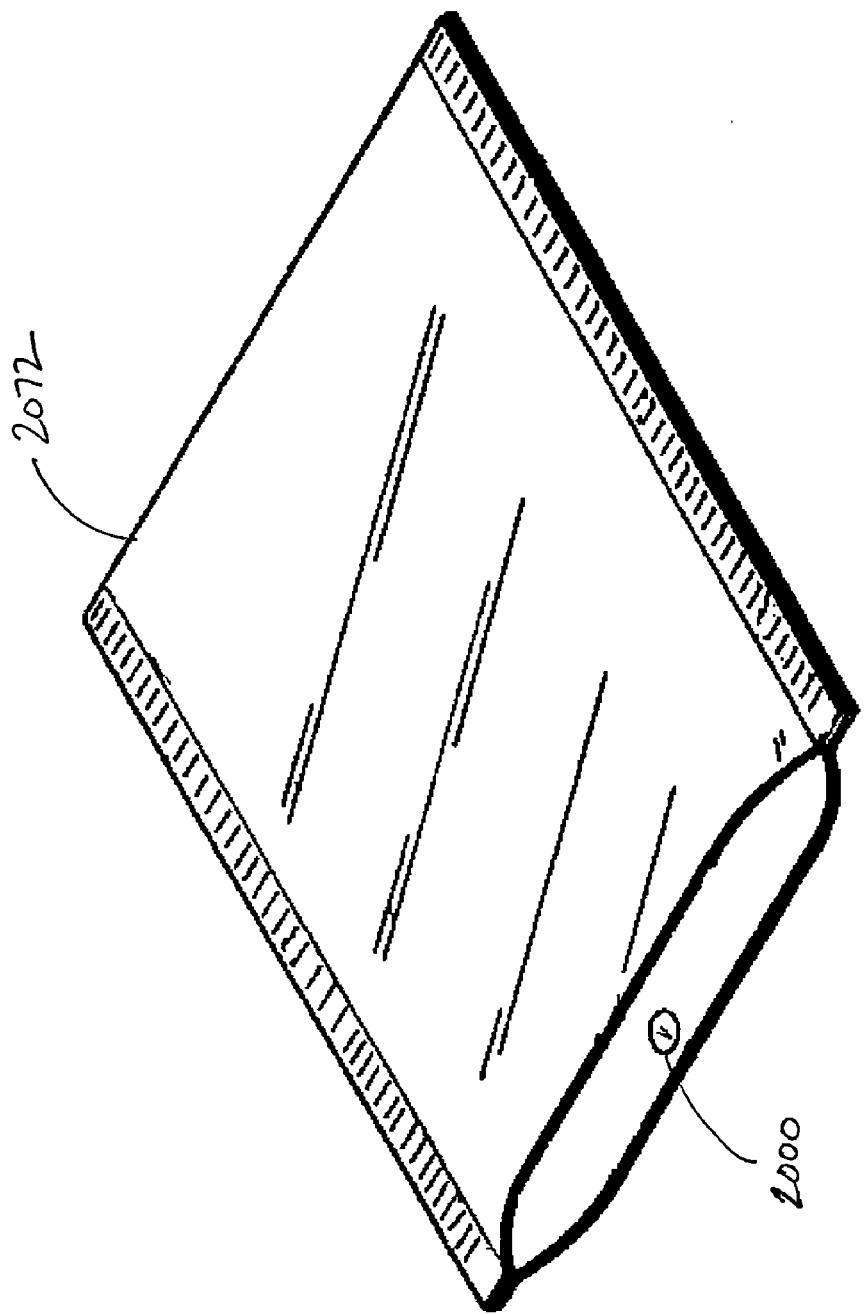
FIG. 20 is an enlarged perspective view of a static shield bag having a static detecting apparatus mounted thereto in accordance with preferred embodiments of the present invention.
Figure 21:
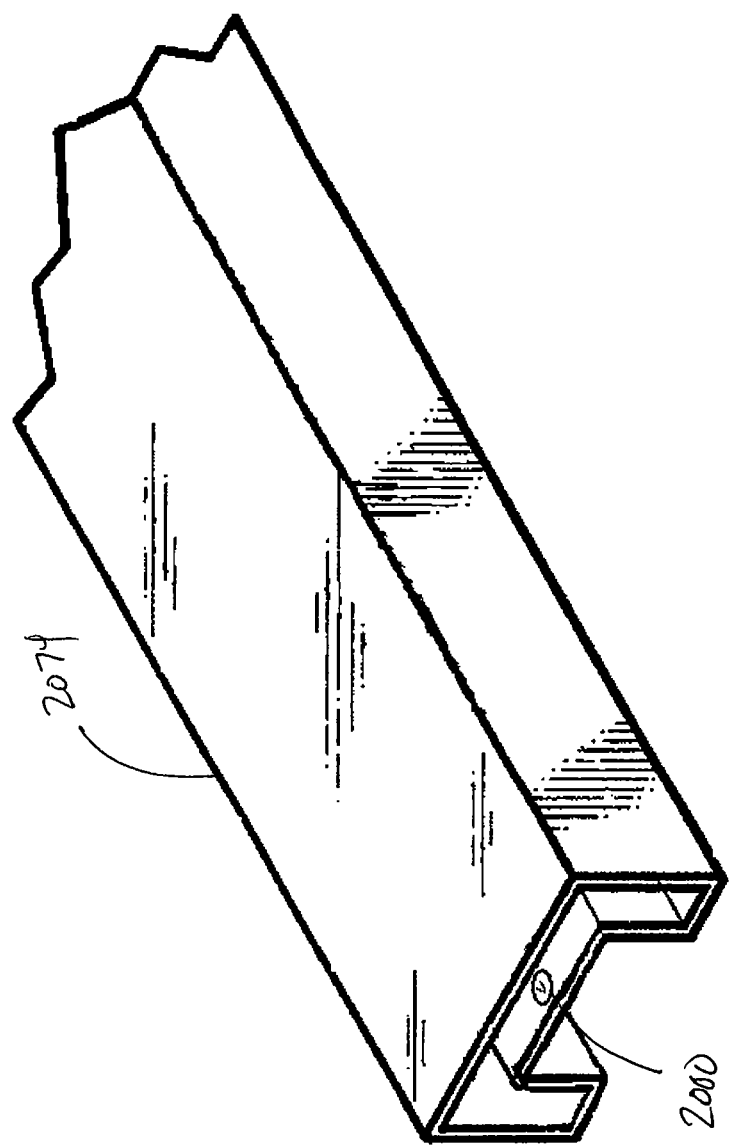
FIG. 21 is an enlarged partial perspective view of an integrated circuit shipping tube having a static detecting apparatus mounted thereto in accordance with preferred embodiments of the present invention.

The static detector 2000 may also be placed on packaging materials, such as a static shield bag 2072 (FIG. 20) or an IC shipping tube 2074 (FIG. 21). ESD packaging materials are produced with anti-static chemical additives or coatings that minimize the generation or accumulation of static charge within the packaging material. These chemical additives and coatings may lose their effectiveness over time and the packaging becomes susceptible to generating and accumulating charge. The static detector 2000 indicates when the static shield bag 2072, IC shipping tube 2074, or the like packaging has degraded to an undesirable condition for ESD sensitive equipment.

Figure 22:
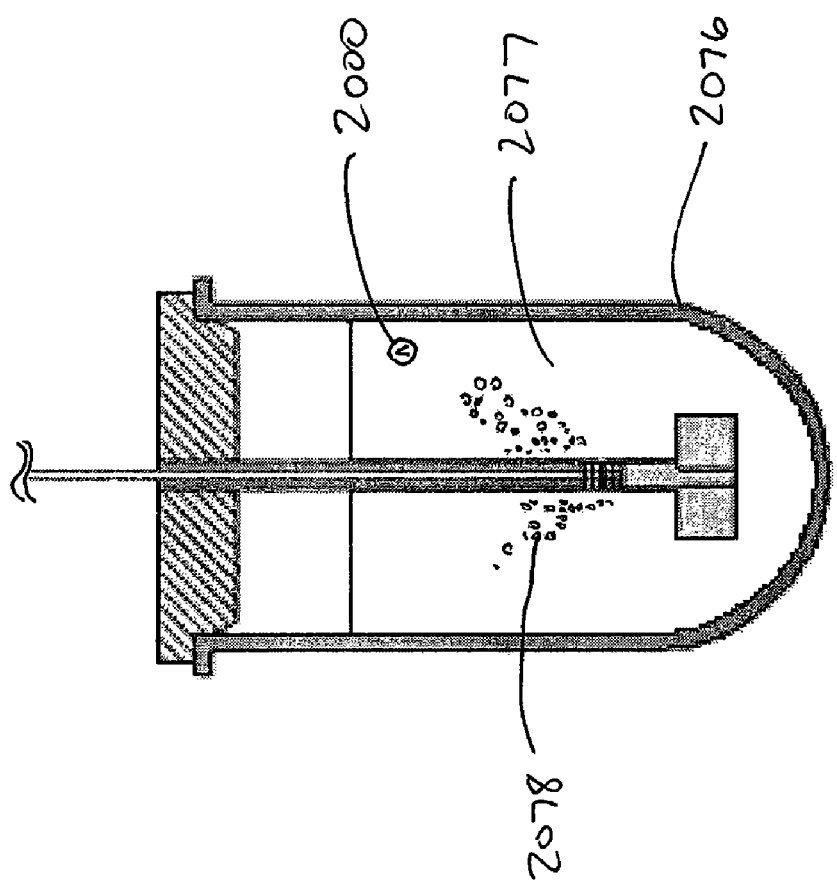
FIG. 22 is a schematic view of a container of liquid having a static detecting apparatus disposed therein in accordance with preferred embodiments of the present invention.

As shown in FIG. 22, the static detector 2000 may also be placed in a container 2076 with a fluid 2077, such as de-ionized water, which is often used in manufacturing electronics. Generation of carbon dioxide 2078 or other fluid disturbances can cause static buildup, and the static detector 2000 indicates whether the static generated in the fluid 2077 exceeds a desired level.

Figure 23:
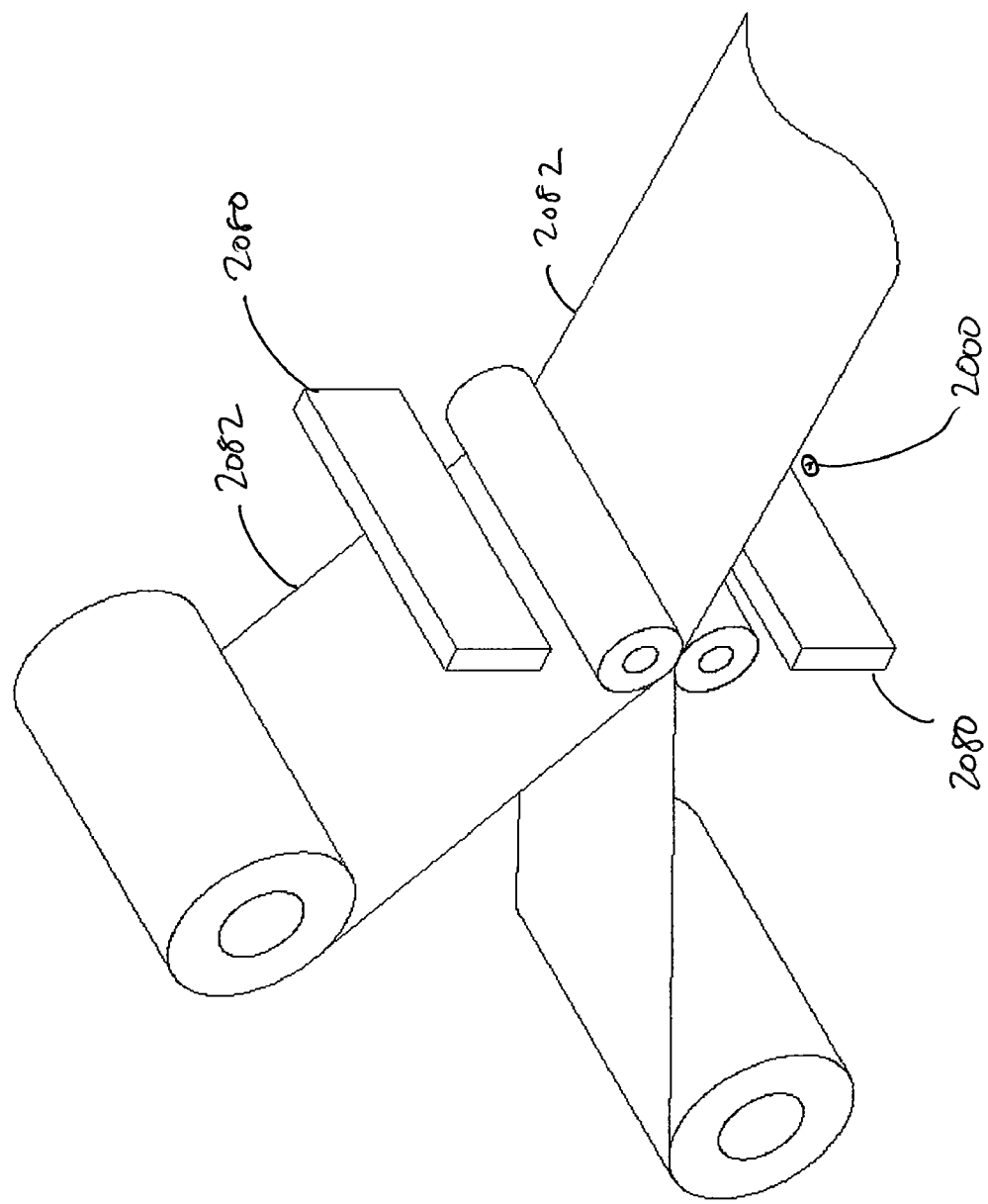
FIG. 23 is a schematic view of an ionizing system having a static detecting apparatus mounted thereto in accordance with preferred embodiments of the present invention.

FIG. 23 shows a static detector 2000 positioned near one or more ionizers 2080 that place or remove charge from a material 2082. The material 2082 may be, for example, a web of sheet plastic. The static detector 2000 provides a much smaller sensor for detecting whether the ionizers 2080 are functioning properly. The static detector 2000, particularly in MEMS embodiments, could also replace the common charge plate monitor for machines. Currently the smallest charge plate monitors are approximately 1 inch by 1 inch. The relatively small size of the static detector 2000 makes it especially suited for smaller volumes within equipment.

For embodiments shown in FIGS. 4-15, the static detector 2000 preferably has the appearance to the naked eye of a dot. It may be referred to as a "static dot." In one preferred embodiment, the static detector 2000 is preferably generally round with a diameter of about 2 to about 3 millimeters (mm).

As seen in the drawings, the static detector 2000 may include a number of "active" and "passive" embodiments, that is, embodiments wherein the static detector 2000 requires or does not require power. Passive embodiments include the embodiments shown in FIGS. 4-7, 10-13, and 15, and active embodiments include the embodiments shown in FIGS. 8-9, 14, and 16-18, although any of the embodiments shown may be modified to be active or passive.

Passive embodiments have the advantage that no power is required, which reduces cost and complexity of the static detector 2000. One advantage of the active embodiments is the ability to provide a wider range of easily identifiable indicators, such as lights. Power for active embodiments may be supplied, for example, by an internal battery (e.g. FIG. 14), solar cells, connection to an external power supply, radio frequency signals (similar to radio frequency identification (RFID) tags), or the like.

From the foregoing, it can be seen that embodiments of the present invention comprise an apparatus for detecting a static field. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. An apparatus for detecting a static field, the apparatus comprising:
   two surfaces of conductive material that are
      (i) electrically coupled to each other, and
      (ii) adjacent to each other, wherein the two surfaces repel each other in the presence of a static field,
   the conductive material having a deformation property such that stress caused by repulsion of the two surfaces from each other by at least a predetermined distance causes at least one of the surfaces to permanently deform.

2. The apparatus of claim 1, wherein the conductive material has a degree of plasticity such that stress caused by the repulsion of the two surfaces from each other by at least a predetermined distance causes at least one of the surfaces to permanently bend.

3. The apparatus of claim 2, wherein each of the two surfaces has a length of 1 inch, a width of 0.25 inches, and a thickness of 0.001 inches.

4. The apparatus of claim 3, wherein the conductive material is aluminum.

5. The apparatus of claim 1, wherein the conductive material has a fracture point such that stress caused by the repulsion of the two surfaces from each other by at least a predetermined distances causes at least one of the surfaces to fracture.

6. The apparatus of claim 5, wherein the two surfaces of conductive material are conductive coatings of respective beams constructed of an insulative material.

7. An apparatus for detecting a static field, the apparatus comprising:
   (a) two surfaces of conductive material that are
      (i) electrically coupled to each other, and
      (ii) adjacent to each other in a rest position,
   wherein the two surfaces repel each other in the presence of a static field, at least one of the surfaces having a movement path resulting from the repulsion of the two surfaces; and
   (b) at least one stopper located in the movement path of at least one of the surfaces, the stopper preventing the at least one surface from returning to the rest position after the two surfaces are repulsed from one another by at least a predetermined distance.

8. The apparatus of claim 7, further comprising an electrical circuit electrically coupled to the at least one stopper and an indicator electrically coupled to the electrical circuit.

9. The apparatus of claim 8, wherein contact between the at least one stopper and the at least one surface enables electricity to flow through the electrical circuit to the indicator.

10. The apparatus of claim 9, wherein the indicator is a light.

11. The apparatus of claim 7, wherein a stopper is located in each respective movement path of the two surfaces, each stopper preventing its respective surface from returning to the rest position after the two surfaces are repulsed from one another by at least a predetermined distance.

12. The apparatus of claim 7, wherein a plurality of stoppers are located in the movement path of at least one of the surfaces, the location of each of the plurality of stoppers being proportional to a relative measure of static field strength experienced by the two surfaces.

13. The apparatus of claim 7, wherein one of the two surfaces is fixed and the other of the two surfaces is free to move during repulsion from each other in the presence of the static field.

* * * * *